(12) United States Patent
Yoon et al.

(10) Patent No.: US 11,740,296 B2
(45) Date of Patent: Aug. 29, 2023

(54) DEVICE AND METHOD FOR MEASURING RESISTANCE OF PRESSURIZED SEPARATOR

(71) Applicant: LG CHEM, LTD., Seoul (KR)

(72) Inventors: Jong Keon Yoon, Daejeon (KR); Jeong Beom Lee, Daejeon (KR); Hoe Jin Hah, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 130 days.

(21) Appl. No.: 17/286,928

(22) PCT Filed: Oct. 6, 2020

(86) PCT No.: PCT/KR2020/013562
§ 371 (c)(1),
(2) Date: Apr. 20, 2021

(87) PCT Pub. No.: WO2021/080212
PCT Pub. Date: Apr. 29, 2021

(65) Prior Publication Data
US 2022/0308118 A1    Sep. 29, 2022

(30) Foreign Application Priority Data
Oct. 23, 2019  (KR) .......................... 10-2019-0132213

(51) Int. Cl.
*G01R 31/385* (2019.01)
*H01M 50/40* (2021.01)
(Continued)

(52) U.S. Cl.
CPC ......... *G01R 31/3865* (2019.01); *G01N 27/12* (2013.01); *G01R 31/389* (2019.01); *H01M 10/4285* (2013.01); *H01M 50/40* (2021.01)

(58) Field of Classification Search
CPC . G01R 31/3865; G01R 31/389; H01M 50/40; H01M 10/4285; G01N 27/12
(Continued)

(56) References Cited

U.S. PATENT DOCUMENTS

2007/0154810 A1*  7/2007 Kim ...................... H01M 4/366
                                                      429/200
2009/0146663 A1   6/2009 Takeno et al.
(Continued)

FOREIGN PATENT DOCUMENTS

CN    101576607 A    11/2009
CN    102998534 A    3/2013
(Continued)

OTHER PUBLICATIONS

International Search Report (translation) dated Jan. 15, 2021 issued in corresponding International Patent Application No. PCT/KR2020/013562.
(Continued)

*Primary Examiner* — Lee E Rodak
*Assistant Examiner* — Trung Q Nguyen
(74) *Attorney, Agent, or Firm* — Morgan, Lewis & Bockius LLP (57) ABSTRACT

The present invention relates to a device and method which can measure, in real time, the resistance, depending on pressure changes, of a separator that is immersed in an electrolyte, and enables analysis of the resistance properties of a separator reflecting the real operating state of a secondary battery.

12 Claims, 5 Drawing Sheets

(51) Int. Cl.
  *G01N 27/12* (2006.01)
  *G01R 31/389* (2019.01)
  *H01M 10/42* (2006.01)
(58) Field of Classification Search
  USPC ........ 324/705, 500, 510–515, 323–368, 600, 324/637, 200, 263, 522, 713, 76.11, 324/76.69–76.77
  See application file for complete search history.

(56) References Cited

U.S. PATENT DOCUMENTS

| | | | |
|---|---|---|---|
| 2016/0116540 A1 | 4/2016 | Zheng et al. | |
| 2017/0294688 A1 | 10/2017 | Jang et al. | |

FOREIGN PATENT DOCUMENTS

| | | | | |
|---|---|---|---|---|
| CN | 104678173 A | | 6/2015 | |
| CN | 108110342 | * | 1/2018 | ............. G01R 27/02 |
| CN | 108110342 A | | 6/2018 | |
| CN | 108627387 A | | 10/2018 | |
| CN | 209167417 U | | 7/2019 | |
| JP | S57-33366 A | | 2/1982 | |
| JP | H11-248807 A | | 9/1999 | |
| JP | 2005-093123 A | | 4/2005 | |
| JP | 2009-009812 A | | 1/2009 | |
| JP | 2009-243929 A | | 10/2009 | |
| JP | 2010-161011 A | | 7/2010 | |
| JP | 2013-089340 A | | 5/2013 | |
| JP | 2013-201312 A | | 10/2013 | |
| JP | 2013-222617 A | | 10/2013 | |
| JP | 2015-194435 A | | 11/2015 | |
| JP | 2018-147565 A | | 9/2018 | |
| KR | 10-2005-0090457 A | | 9/2005 | |
| KR | 10-0591441 B1 | | 6/2006 | |
| KR | 10-2011-0021970 A | | 3/2011 | |
| KR | 10-2014-0003388 A | | 1/2014 | |
| KR | 10-2017-0107738 A | | 9/2017 | |
| KR | 10-2019-0006920 A | | 1/2019 | |
| KR | 10-1980844 B1 | | 5/2019 | |

OTHER PUBLICATIONS

Extended European Search Report dated Oct. 12, 2021 issued by the European Patent Office in corresponding European patent application No. 20873373.3.

Office action dated Jun. 26, 2023 issued in corresponding Chinese Patent Application No. 202080005722.X. (See English abstract).

* cited by examiner

DEVICE AND METHOD FOR MEASURING RESISTANCE OF PRESSURIZED SEPARATOR

TECHNICAL FIELD

The present invention relates to a press type apparatus and method for measuring a resistance of a separator.

This application claims the benefit of priority based on Korean Patent Application No. 10-2019-0132213, filed on Oct. 23, 2019, and the entire contents of the Korean patent application are incorporated herein by reference.

BACKGROUND ART

As the price of energy sources increases due to the depletion of fossil fuels, and interest in environmental pollution is amplified, the demand for eco-friendly alternative energy sources is increasing. In particular, as technology development and demand for mobile devices increase, the demand for secondary batteries as energy sources is rapidly increasing. Regarding the shape of the secondary battery, there is a high demand for a pouch-type secondary battery in that it can be applied to mobile products such as mobile phones with a small thickness.

Such a pouch-type secondary battery has a structure in which an electrode assembly is embedded in a pouch-type battery case formed of an aluminum laminate sheet. Specifically, in the pouch-type secondary battery, a stack-type or stack-folding electrode assembly in which a positive electrode, a separator, and a negative electrode are sequentially stacked is accommodated in the battery case. Each positive electrode and negative electrode are electrically connected by electrode tabs, and electrode leads that are drawn out are connected to the electrode tabs. After the electrode assembly, to which the electrode tab and the electrode lead are connected, is accommodated in a pouch-type battery case, an electrolyte is injected, and the battery case is sealed with part of the electrode lead exposed to the outside, to thereby assemble a secondary battery.

Conventionally, the insulating properties of the separator itself were measured to evaluate the resistance characteristics of the separator. Specifically, a separator was pinched between the upper jig and the lower jig, and a voltage was applied between the two jigs to thereby measure a voltage when a current greater than a reference value flowed through the separator, as the dielectric breakdown voltage.

However, with the above-described method, only the insulating characteristics of the separator itself can be measured, and insulation characteristics that reflect the charge/discharge characteristics of the electrode assembly in real time cannot be measured. The electrode assembly including the separator is accommodated in the battery case in a state that is impregnated in the electrolyte solution. In addition, the dendrite generated during the charging and discharging process of the secondary battery causes a change in volume, which causes pressure on the separator. Therefore, there is a need for a technology capable of confirming the resistance characteristics of the separator reflecting the actual use conditions of the secondary battery.

DISCLOSURE

Technical Problem

The present invention was invented to solve the above problems, and an object of the present invention is to provide an apparatus and method for evaluating resistance of a separator reflecting the actual operating state of a secondary battery.

Technical Solution

An press type apparatus for measuring a resistance of a separator according to the present invention includes: a receiving portion having a structure in which an upper part is opened and a lower part and a side surface are closed, and which accommodates a separator immersed in an electrolyte solution; a molding unit configured to be inserted through an open upper part of the receiving portion to press the received separator; a pressure control unit configured to control a pressure applied to the separator through a height adjustment of at least one of the receiving portion and the molding unit; an electrode unit including a first electrode electrically connected to an inner bottom surface of the receiving portion, protruding to an outside of the receiving portion and electrically connected to a resistance measuring unit, and a second electrode electrically connected to a lower surface of the molding unit, protruding to an outside of the molding unit and electrically connected to the resistance measuring unit; and a resistance measuring unit configured to be connected to the first and second electrodes of the electrode unit, respectively, to thereby measure a resistance of the separator.

In one example, the press type apparatus for measuring a resistance of a separator further includes a gasket configured to be formed outside a lower part of the molding unit inserted into the receiving portion, and maintain airtightness of an inner space partitioned by an inner side of the receiving portion and a lower surface of the molding unit.

In another example, the press type apparatus for measuring a resistance of a separator further includes a pressure measuring unit configured to be located below the receiving portion and measure a pressure transmitted to the receiving portion by pressurization of the molding unit.

In one example, the press type apparatus for measuring a resistance of a separator further includes at least one of: a pressure display unit configured to indicate a pressure value controlled by the pressure control unit; and a resistance display unit configured to indicate a resistance value measured by the resistance measuring unit.

In a specific example, in the press type apparatus for measuring a resistance of a separator, the pressure control unit increases the pressure continuously or sequentially from $P_0$ to $P_1$ and then lowers the pressure continuously or sequentially from $P_1$ to $P_0$, and $P_0$ represents a pressure at a state in which the separator has not been pressurized, and $P_1$ represents a preset reference pressure, and the resistance measuring unit measures a resistance of the separator in real time according to a pressure change by the pressure control unit.

The present invention provides an press type apparatus for measuring resistance of a separator. In one example, according to a method for measuring a resistance of a separator, in a state in which the separator immersed in an electrolyte solution is accommodated in a receiving portion having a structure in which an upper part is opened and a lower part and a side surface are closed, the method includes a step of changing a pressure applied to the separator received by a molding unit inserted through the opened open upper part of the receiving portion and measuring a resistance of the separator while the pressure is changed.

In a specific example, in the method for measuring a resistance of a separator, a pressure applied to the received separator is increased continuously or sequentially from $P_0$ to $P_1$, and is then decreased continuously or sequentially from $P_1$ to $P_0$, and wherein $P_0$ represents a pressure at a state in which the separator has not been pressurized, and $P_1$ represents a preset reference pressure. Here, $P_0$ represents a pressure in a state in which the separator is not pressurized, and $P_1$ represents a preset reference pressure.

In one example, the method for measuring a resistance of a separator includes a step of determining that the separator is defective if any one or more of: an initial resistance ($R_S$) measured at $P_0$ in a process of increasing the pressure; a resistance measured at pressure P1 ($R_H$); and a last resistance ($R_F$) measured at $P_0$ during pressure reduction is outside a predetermined reference range.

In another example, the method for measuring a resistance of a separator includes a step of determining that the separator is defective if a difference ($R_D$) between the initial resistance ($R_S$) measured at $P_0$ in the process of increasing the pressure and the last resistance ($R_F$) measured at $P_0$ in the process of lowering the pressure is outside the predetermined reference range.

In one example, in the method for measuring a resistance of a separator, the pressure applied to the received separator is continuously or sequentially changed, and the resistance of the separator according to a change in pressure is measured in real time.

Advantageous Effects

According to an press type apparatus and method for measuring resistance of a separator according to the present invention, the resistance according to the pressure change is measured in real time for the separator impregnated with the electrolyte solution, and through this, it is possible to analyze the resistance characteristics of the separator reflecting the actual operating state of the secondary battery.

DETAILED DESCRIPTION OF THE PREFERRED EMBODIMENTS

Hereinafter, the present invention will be described in detail with reference to the drawings. The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention.

The present invention provides an press type apparatus for measuring resistance of a separator. Specifically, the apparatus includes:

a receiving portion having a structure in which an upper part is opened and a lower part and a side surface are closed, and which accommodates a separator immersed in an electrolyte solution;

a molding unit configured to be inserted through an open upper part of the receiving portion to press the received separator;

a pressure control unit configured to control a pressure applied to the separator through adjusting a height of at least one of the receiving portion and the molding unit;

an electrode unit including a first electrode electrically connected to an inner bottom surface of the receiving portion, protruding to an outside of the receiving portion and electrically connected to a resistance measuring unit, and a second electrode electrically connected to a lower surface of the molding unit, protruding to an outside of the molding unit and electrically connected to the resistance measuring unit; and a resistance measuring unit configured to be connected to the first and second electrodes of the electrode unit, respectively, to thereby measure a resistance of the separator.

The receiving portion has an open upper portion, and a closed lower portion and a closed side surface. Through this, the separator immersed in the electrolyte solution is accommodated in the receiving portion. The molding unit is inserted through the open top of the receiving portion to press the received separator.

Generally, the electrode assembly including the separator is accommodated in the battery case in a state that is impregnated in the electrolyte solution. In addition, the dendrite generated during the charging and discharging process of the secondary battery causes a change in volume, which causes pressure on the separator. In the present invention, pressure is applied to the separator immersed in the electrolyte solution, which reflects the actual conditions of use of the secondary battery.

A first electrode electrically connected to an inner bottom surface of the receiving portion and a second electrode electrically connected to a lower surface of the molding unit are respectively formed to protrude out of the apparatus. A resistance measuring unit is connected to the first and second electrodes. Accordingly, the apparatus according to the present invention can measure the resistance of the separator according to the applied pressure in real time while applying pressure to the separator.

In addition, the resistance measuring unit is not particularly limited as long as it measures the resistance of the separator impregnated with the electrolyte solution. For example, the resistance measuring unit calculates a resistance through AC impedance measurement.

In one example, the apparatus further includes a gasket configured to be formed outside a lower part of the molding unit inserted into the receiving portion, and maintain airtightness of an inner space partitioned by an inner side of the receiving portion and a lower surface of the molding unit. The gasket is formed outside the lower portion of the molding unit inserted into the receiving portion. The material of the gasket is not particularly limited as long as it can maintain the airtightness of the inner space partitioned by the inner side of the receiving portion and the lower surface of the molding unit. For example, the gasket may be in the form of an O-ring made of a rubber material. One to five O rings may be formed in parallel outside the lower portion of the molding unit.

In one example, the measuring apparatus further includes a pressure measuring unit positioned at the lower portion of the receiving portion and measuring a pressure transmitted to the receiving portion by pressurization of the molding unit. Since the pressure measuring unit is located under the receiving portion, it is possible to effectively measure the pressure transmitted to the receiving portion. For example, the pressure measuring unit is in the form of an ultra-compact compression load cell located under the receiving portion.

In one example, the apparatus further includes at least one of: a pressure display unit configured to indicate a pressure value controlled by the pressure control unit; and a resistance display unit configured to indicate a resistance value measured by the resistance measuring unit. The pressure display unit displays a pressure value measured by the pressure measuring unit described above. For example, the pressure display unit is a digital display device. In addition, the resistance display unit displays a resistance value measured by a resistance measuring unit. For example, the resistance display unit may calculate a resistance value for each pressure value.

In yet another example, the pressure control unit continuously or sequentially increases the pressure from $P_0$ to $P_1$, and then continuously or sequentially lowers the pressure from $P_1$ to $P_0$. In addition, the resistance measuring unit measures the resistance of the separator according to the pressure change by the pressure control unit in real time.

Here, $P_0$ represents a pressure in a state in which the separator is not pressurized, and $P_1$ represents a preset reference pressure. For example, $P_0$ can be expressed as 0 Mpa as the pressure at a state in which the separator has not been pressed, and $P_1$ represents a preset reference pressure and can be set in a range of from 4 to 8 Mpa.

Specifically, although there is a difference depending on the assembly type or type of the battery, a pressure of about 4 Mpa is applied when charging in a cell at a level of 2.1 Ah stack cell (11 stack). In this case, the $P_1$ can be set in the range of 4 to 5 Mpa.

The present invention also provides a method for measuring resistance of a separator, and the measuring method can be performed using the measuring apparatus described above.

In one example, according to the method for measuring a resistance of a separator, in a state in which the separator immersed in an electrolyte solution is accommodated in a receiving portion having a structure in which an upper part is opened and a lower part and a side surface are closed, the method includes a step of changing a pressure applied to the separator received by a molding unit inserted through the opened upper part of the receiving portion and measuring a resistance of the separator while the pressure is changed.

In one example, a pressure applied to the received separator is increased continuously or sequentially from $P_0$ to $P_1$, and is then decreased continuously or sequentially from $P_1$ to $P_0$, and herein, $P_0$ represents a pressure at a state in which the separator has not been pressurized, and $P_1$ represents a preset reference pressure. The description of $P_0$ and $P_1$ is the same as before.

In yet another embodiment, in the separator resistance measurement method according to the present invention, it is also possible to determine whether the separator is defective by measuring the resistance of the separator.

In a specific example, the method includes a step of determining that the separator is defective if any one or more of: an initial resistance ($R_S$) measured at $P_0$ in a process of increasing the pressure; a resistance measured at pressure P1 ($R_H$); and a last resistance ($R_F$) measured at $P_0$ during pressure reduction is outside a predetermined reference range. This is to set the reference resistance range for each pressure on the separator, and if the measured value is out of this range, it is determined as a defect.

In another example, the method includes a step of determining that the separator is defective if a difference ($R_D$) between the initial resistance ($R_S$) measured at $P_0$ in the process of increasing the pressure and the last resistance ($R_F$) measured at $P_0$ in the process of lowering the pressure is outside the predetermined reference range. When removing the applied pressure after applying pressure to the separator, whether or not there is a change in physical properties with respect to the pressure of the separator is confirmed by comparing the initial resistance value and the late resistance value of the separator. If the change in the resistance value exceeds the reference range, it is determined as a defect.

In one embodiment, in the measurement method, the pressure applied to the accommodated separator is continuously or sequentially changed, and the resistance of the separator according to the change in pressure is measured in real time. The measuring method according to the present invention has the advantage of being able to check in real time a change in resistance of a separator according to a continuous or sequential pressure change.

In the present invention, the separator subject to evaluation may be made of any porous substrate used in a secondary battery, and for example, a polyolefin-based porous membrane or a nonwoven fabric may be used, but the present invention is not particularly limited thereto.

Examples of the polyolefin-based porous membrane include polyethylene such as high density polyethylene, linear low density polyethylene, low density polyethylene, ultra high molecular weight polyethylene, and a membrane in which polyolefin-based polymers, such as polypropylene, polybutylene, and polypentene, are each formed alone or in a mixture thereof.

In addition, the separator includes a case where a porous coating layer including inorganic particles is formed on one or both surfaces of the porous substrate. In one embodiment, the separator includes a porous polymer substrate and a porous coating layer formed on one or both surfaces of the porous substrate. The polymer substrate may have a polymer substrate in which pores are formed during polymerization or a structure in which pores are formed through stretching. In addition, the porous coating layer may have a structure in which inorganic particles are coated on the surface of a polymer substrate. The inorganic particle coating layer serves to increase the conductivity of ions without inhibiting the porosity of the polymer substrate.

For example, the porous polymer substrate is formed of a polyolefin resin, the porous coating layer includes inorganic particles, a lithium salt, and a binder resin, and the inorganic particles are connected and fixed to each other by a binder resin to form a porous structure. Specifically, the porous polymer substrate is a thin film in the form of a sheet and can be applied if it has excellent ion permeability and mechanical strength. The material of such a polymer base may include a polyolefin-based film such as polypropylene having excellent chemical resistance, and a sheet or nonwoven fabric made of glass fiber or polyolefin, etc. As commercially available products, for example, Celgard TM2400, 2300 (manufactured by Hoechest Celanse corp), polypropylene membrane (manufactured by Ube Industrial Ltd. or Pall RAI) or polyethylene (Tonen or Entek) group products may be used, but is not limited thereto. In addition, the porous coating layer serves to supplement the mechanical strength of the porous reinforcing material and impart heat resistance.

The inorganic particles are connected and fixed to each other by a binder resin described below to form a porous structure. The porous coating layer has a porous structure by an interstitial volume between the inorganic particles, and the interstitial volume is a space defined by inorganic particles substantially surface-contacted in a closed packed structure or densely packed structure.

The binder resin is not particularly limited as long as it exhibits a bonding force with the electrode mixture layer laminated on the current collector and a bonding force between inorganic components and lithium salts in the mixed coating layer and is not easily dissolved by an electrolyte solution. For example, the binder resin may be one or a mixture of two or more selected from the group consisting of polyvinylidene fluoride (PVdF), polyvinylidene fluoride-cohexafluoropropylene, polyvinylidene fluoride-trichloroethylene, polyvinylidene fluoride-chlorotrifluoroethylene (PVdF-CTFE), polymethyl methacrylate, polyacrylonitrile, polyvinylpyrrolidone, polyvinylacetate, ethylene-vinyl acetate copolymer (polyethylene-co-vinyl acetate), polyethylene oxide, cellulose acetate, cellulose acetate butyrate, cellulose acetate propionate, cyanoethylpullulan, cyanoethylpolyvinylalcohol, cyanoethylcellulose, cyanoethylsucrose, pullulan, carboxyl methyl cellulose, acrylonitrile-styrene-butadiene copolymer, and polyimide, and may specifically be PVdF or PVdF-CTFE.

The content of the binder resin may be in the range of 0.1 to 20% by weight or 1 to 10% by weight of 100% by weight of the porous coating layer in consideration of the bonding strength between inorganic particles and/or lithium salts, and the bonding strength between the current collector and the electrode mixture.

In addition, the present invention measures the resistance of the separator impregnated in the electrolyte solution. The same composition as that of the electrolyte solution applied to the secondary battery may be applied. In one example, a non-aqueous electrolyte containing a non-aqueous electrolyte solution may be used as the electrolyte solution. Examples of the non-aqueous electrolyte include N-methyl-2-pyrrolidinone, propylene carbonate, ethylene carbonate, butylenecarbonate, dimethyl carbonate, diethyl carbonate, gamma-Butyrolactone, 1,2-dimethoxyethane, tetrahydroxyfuran, 2-methyltetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxymethane, dioxolane derivatives, sulfolane, methyl sulfolane, 1,3-dimethyl-2-imidazolidinone, propylene carbonate derivatives, tetrahydrofuran derivatives, ethers, methyl pyrophosphate, ethyl propionate, etc. However, it is not particularly limited thereto, and a number of electrolyte components commonly used in the field of lithium secondary batteries may be added or subtracted within an appropriate range.

The measuring apparatus and measuring method according to the present invention can be applied to various types of separators for secondary batteries. For example, the separator is a separator for a lithium secondary battery.

The lithium secondary battery includes, for example, an electrode assembly including a positive electrode, a negative electrode, and a separator interposed between the positive electrode and the negative electrode; a non-aqueous electrolyte impregnating the electrode assembly; and a battery case containing the electrode assembly and the non-aqueous electrolyte.

The positive electrode has a structure in which a positive electrode active material layer is stacked on one or both sides of a positive electrode current collector. The positive electrode active materials may each independently be a lithium-containing oxide, and may be the same or different. A lithium-containing transition metal oxide may be used as the lithium-containing oxide. In one example, the positive electrode active material layer includes a positive electrode active material, a conductive material, and a binder polymer, and if necessary, may further include a positive electrode additive commonly used in the art.

The current collector used for the positive electrode is a metal having high conductivity, and any metal which the positive electrode active material slurry may be easily attached to and which is not reactive in the voltage range of the electrochemical device can be used. Specifically, non-limiting examples of the current collector for the positive electrode include aluminum, nickel, or a foil manufactured by a combination thereof.

The negative electrode may include a carbon material, lithium metal, silicon or tin as a negative electrode active material. When a carbon material is used as the negative electrode active material, both low crystalline carbon and high crystalline carbon may be used. Representative examples of low crystalline carbon include soft carbon and hard carbon are typical. Representative examples of high crystalline carbon include natural graphite, kish graphite, pyrolytic carbon, mesophase pitch based carbon fiber, meso-carbon microbeads, mesophase pitches, and high-temperature calcined carbons such as petroleum or coal tar pitch derived cokes.

Non-limiting examples of the current collector used for the negative electrode include copper, gold, nickel, or a foil manufactured by a copper alloy or a combination thereof. In addition, the current collector may be used by stacking substrates made of the above materials.

In addition, the negative electrode may include a conductive material and a binder commonly used in the art.

Hereinafter, the present invention will be described in more detail through drawings and the like.

Figure 1:
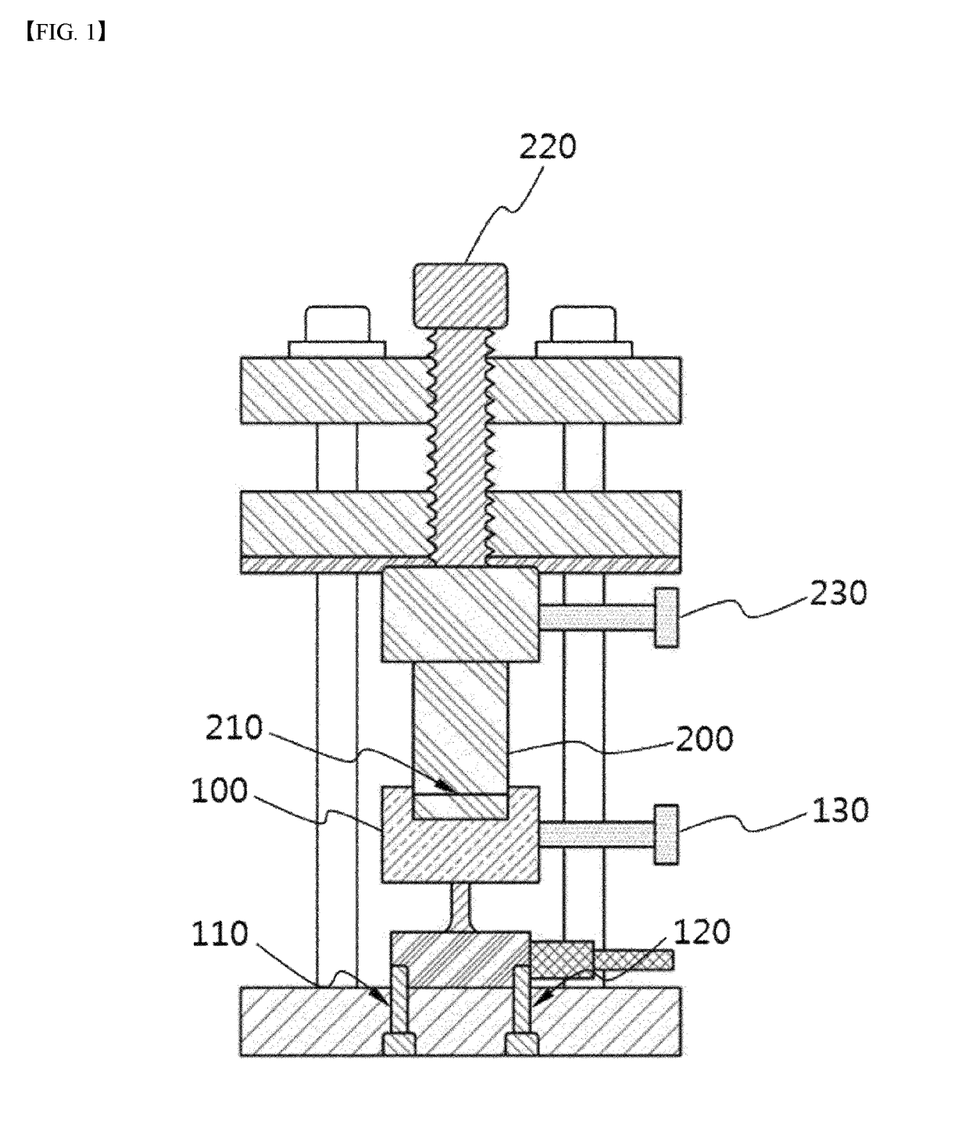
FIG. 1 is a schematic view showing a cross-sectional structure of a measuring apparatus according to an example of the present invention.

FIG. 1 is a schematic view showing a cross-sectional structure of a measuring apparatus according to an example of the present invention. Referring to FIG. 1, the apparatus according to the present invention includes a receiving portion 100 having a structure in which an upper part is opened and a lower part and a side surface are closed, and which accommodates a separator immersed in an electrolyte solution, a molding unit 200 configured to be inserted through an open upper part of the receiving portion 100 to press the received separator, and a pressure control unit 220 configured to control a pressure applied to the separator through adjusting a height of at least one of the receiving portion and the molding unit. Further, a first electrode 130 electrically connected to an inner bottom surface of the receiving portion 100, protruding to an outside of the receiving portion and electrically connected to a resistance measuring unit, and a second electrode 230 electrically connected to a lower surface of the molding unit 200 and protruding to an outside of the molding unit 200 are positioned at the outside of the apparatus. The first electrode 130 and the second electrode 230 are respectively electrically connected to a resistance measuring unit (not shown).

An O-ring gasket 210 is formed outside the molding unit 200. The gasket 210 serves to maintain airtightness of an inner space partitioned by an inner side of the receiving portion 100 and a lower surface of the molding unit 200.

In addition, pressure measuring units 110 and 120 are positioned under the receiving portion 100. The pressure measuring units 110 and 120 measure the pressure transmitted to the receiving portion 100 by pressurization of the molding unit 200. In one example, a micro compression load cell may be applied to the pressure measuring units 110 and 120.

Hereinafter, the present invention will be described in more detail through examples and drawings.

Example 1: Manufacture of Separator

After adding 5% by weight of polyvinylidene fluoride-hexafluoropropylene copolymer (PVdF-HFP) polymer to acetone, and dissolving it at 50° C. for about 12 hours or more, $Al_2O_3$ powder was added so that the binder polymer:Al2O3=10:90 weight ratio.

Subsequently, the $Al_2O_3$ powder was crushed and dispersed using a ball mill method for 12 hours or longer to thereby prepare a binder polymer slurry. The $Al_2O_3$ particle diameter of the binder polymer slurry was about 400 nm.

Therefore, an organic and inorganic composite separator was prepared by coating both sides of a polyethylene porous membrane having a thickness of 18 μm (porosity 45%) to a thickness of 3 μm using a dip coating method. As a result of measuring the organic and inorganic composite separator with a porosimeter, the pore size and porosity in the porous coating layer coated on the polyethylene porous membrane were 0.4 μm and 55%, respectively.

Example 2: Manufacture of Separator

A separator was prepared in the same manner as in Example 1, except that a slurry containing a ceramic component was coated with a thickness of 2.5 μm on both sides of a 7 μm-thick polyethylene porous membrane.

Example 3: Manufacture of Separator

A separator was manufactured in the same manner as in Example 1 except that a slurry containing ceramic components was coated with a thickness of 1.5 μm on both sides of a 9 μm thick porous membrane by selecting one with a high molecular weight among commercially available polyethylene porous membranes.

Example 4: Manufacture of Separator

A 15 μm-thick fabric-free separator having excellent compression resistance properties made of a ceramic and a binder combination without a polyethylene porous membrane fabric was prepared.

Experimental Example: Measurement of Resistance of a Separator According to Pressure The separator specimen prepared in Example 1 was sufficiently impregnated in the electrolyte solution (EC/EMC=1:2 volume ratio, 1 mol $LiPF_6$). The separator specimen impregnated with the electrolyte solution was charged into the receiving portion of the measuring apparatus shown in FIG. 1, and the resistance of the separator according to the pressure was measured.

To measure the resistance of the separator, the resistance was measured while increasing the pressure sequentially from $P_0$ to $P_1$, and the resistance was measured while sequentially lowering the pressure from $P_1$ to $P_0$ again. In this experimental example, the pressure $P_0$ is 0 Mpa, which is the pressure in a state that the separator is not pressurized, and the pressure $P_1$ is set to 4.8 Mpa. The measurement results of the resistance to the separator are shown in FIG. 2.

Figure 2:
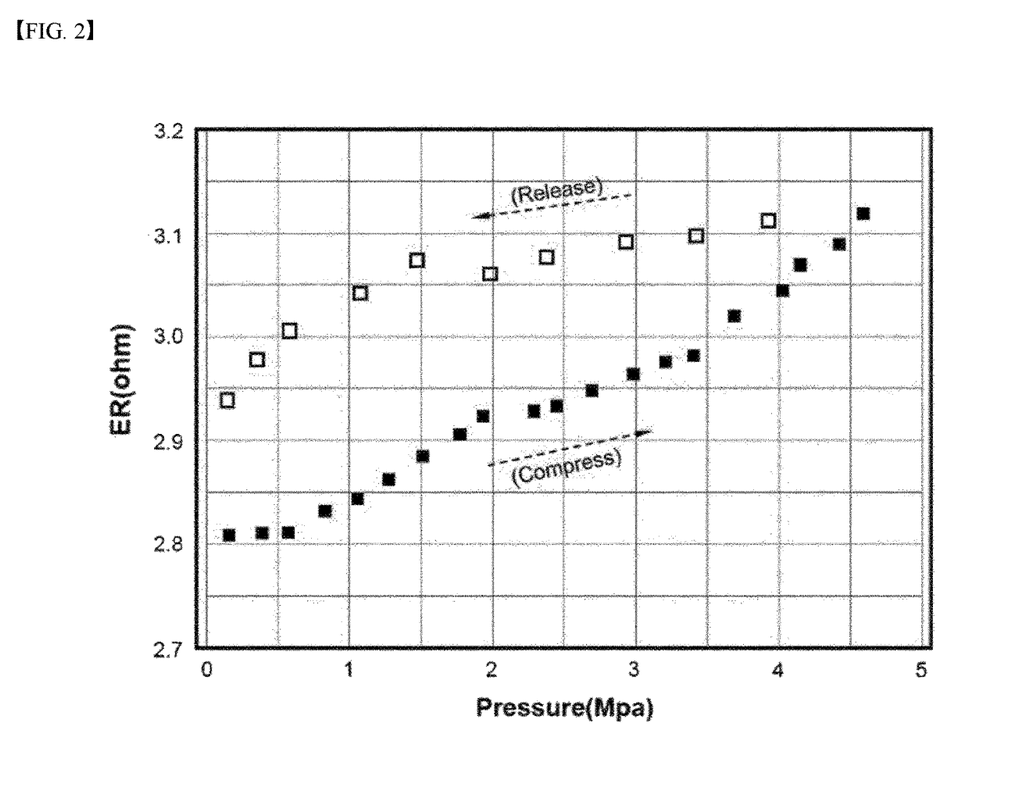
FIG. 2 is a graph showing a resistance measurement result according to pressure for a separator specimen according to Example 1 of the present invention.

Referring to FIG. 2, the resistance value for the separator increased from 2.8Ω to 3.15Ω during the pressing process. During the depressurization process, the resistance value to the separator decreased from 3.15Ω to 2.95Ω. From the results of FIG. 2, when the separator impregnated with the electrolyte solution is pressed, resistance increases due to destruction of internal pores and the like. Then, even if the pressure applied to the separator is reduced or removed, it can be seen that the resistance of the separator does not decrease back to the initial resistance level.

In addition, referring to the result of FIG. 2, the initial resistance of the separator is 2.8Ω, and the final resistance through the process of applying pressure is 2.95Ω. In the case of the separator of this Example, it is calculated that the difference between the initial resistance and the final resistance is 0.15Ω. When the criterion for determining the defect of the separator is set to 0.2Ω based on the difference between the initial resistance and the final resistance of the separator, the separator according to the present Example is determined to be good.

Figure 3:
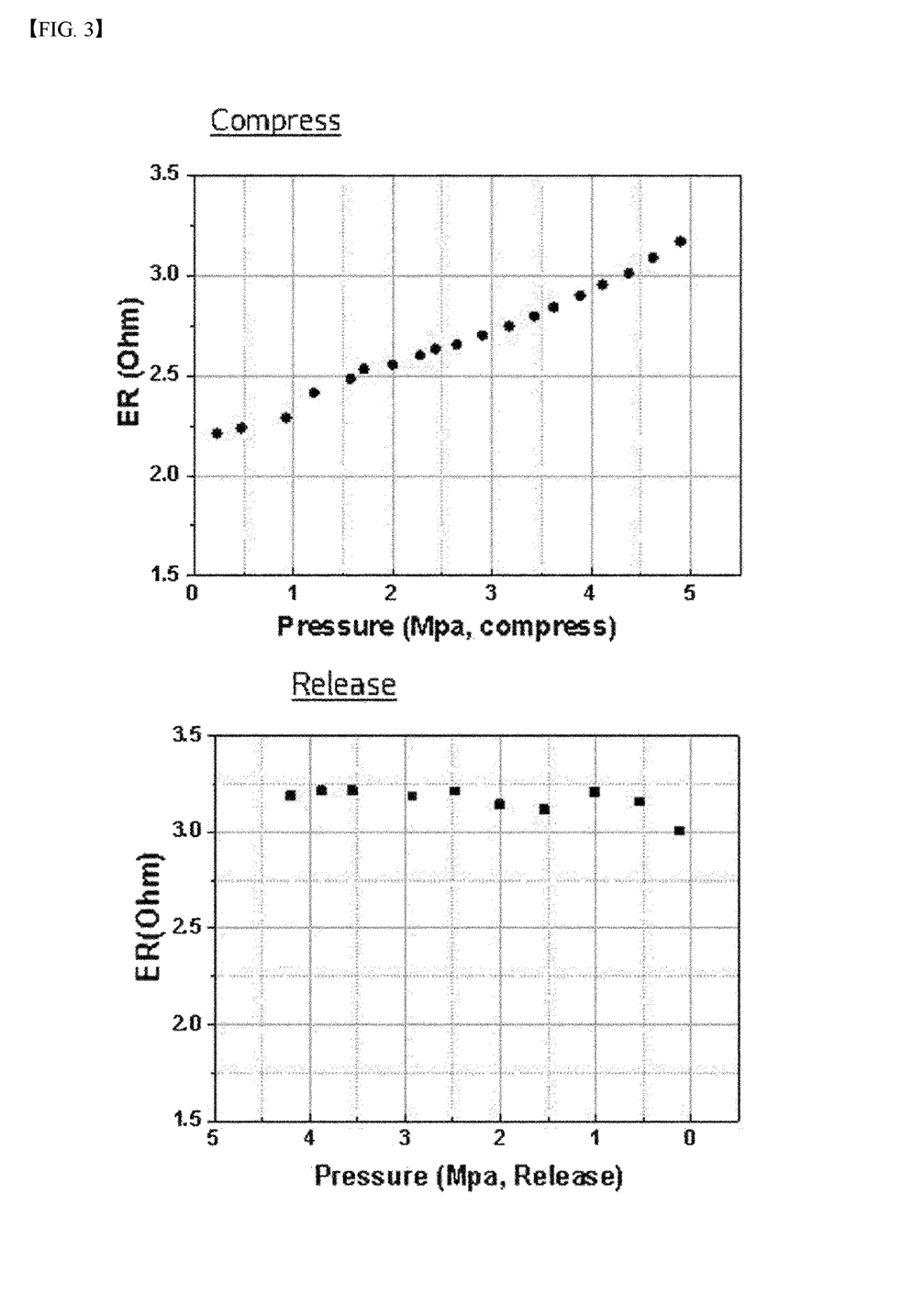
FIG. 3 is a graph showing a resistance measurement result according to pressure for a separator specimen according to Example 2 of the present invention.
Figure 4:
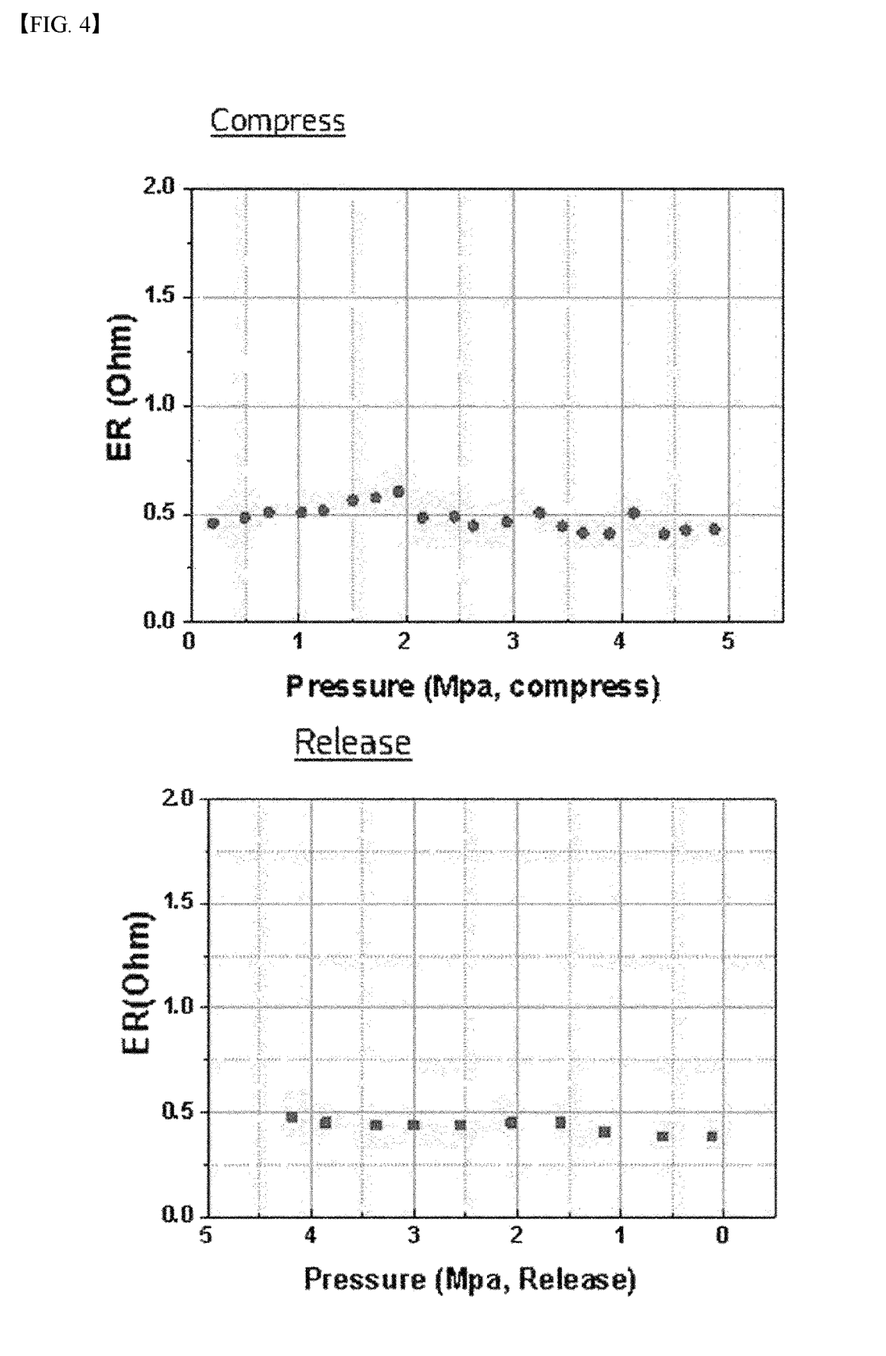
FIG. 4 is a graph showing a resistance measurement result according to pressure for a separator specimen according to Example 3 of the present invention.
Figure 5:
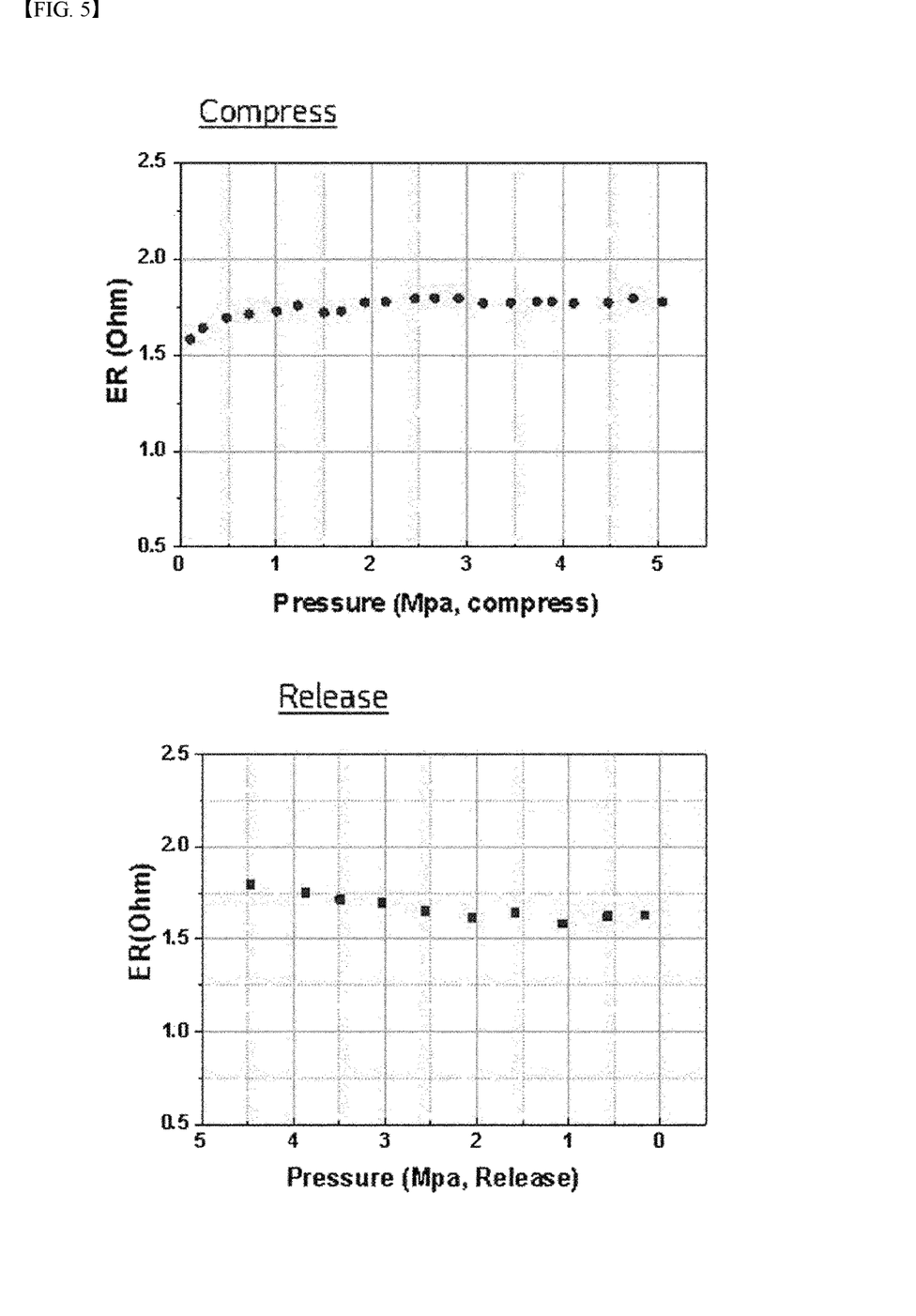
FIG. 5 is a graph showing a resistance measurement result according to pressure for a separator specimen according to Example 4 of the present invention.

In addition to Example 1, resistance of the separator according to pressure was measured in the same manner for Examples 2 to 4, and the results are shown in FIGS. 3 to 5, respectively.

As a result of the measurement, in the case of Example 2 shown in FIG. 3, the initial resistance was 2.24Ω and the final resistance was 3.23Ω, and the increase in resistance compared to the initial resistance was very significant. Further, even if the pressure was lowered sequentially, the resistance in the increased state did not recover. Therefore, when the criterion for determining the defect of the separator is set to 0.2Ω based on the difference between the initial resistance and the final resistance of the separator, it is determined to be defective.

In the case of Example 3 shown in FIG. 4, as a separator using a compression-resistant polyethylene fabric having a high molecular weight, it can be seen that resistance characteristics are excellent because there is little increase in resistance even when the pressure increases at 0.48Ω, which is an initial resistance. Therefore, in the case of the separator of Example 3, it is preferable to set the value of the defect determination reference value to be lower.

In the case of Example 4 shown in FIG. 5, as a non-fabric separator made of a combination of ceramic and a binder, it has excellent compression resistance. Accordingly, even if the pressure increases in the initial resistance 1.61Ω, there is little increase in the resistance, and even if the pressure decreases, the change is not large. Therefore, it is preferable to set the value of the defect determination reference value to be lower, similarly to the separator of Example 3.

In the above, the present invention has been described in more detail through the drawings and examples. However, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

DESCRIPTION OF REFERENCE NUMERALS

100: receiving portion
110, 120: pressure measuring unit

230: first electrode
200: molding unit
210: gasket
220: pressure control unit
230: second electrode

The invention claimed is:

1. A press type apparatus for measuring a resistance of a separator, the apparatus comprising:
   a receiving portion having a structure including: an open upper part; and a lower part and a side surface, which are closed, and thereby receives a separator immersed in an electrolyte solution;
   a molding unit configured to be inserted through the open upper part of the receiving portion to press the received separator;
   a pressure control unit configured to control a pressure applied to the separator by adjusting a height of at least one of the receiving portion and the molding unit;
   an electrode unit including a first electrode electrically connected to an inner bottom surface of the receiving portion, protruding to an outside of the receiving portion and electrically connected to a resistance measuring unit, and a second electrode electrically connected to a lower surface of the molding unit, protruding to an outside of the molding unit and electrically connected to the resistance measuring unit; and
   the resistance measuring unit connected to the first and second electrodes of the electrode unit to thereby measure a resistance of the separator,
   wherein the pressure by the pressure control unit is not applied to the first and second electrodes.

2. The apparatus of claim 1, further comprising a gasket formed outside a lower part of the molding unit inserted into the receiving portion, which maintains airtightness of an inner space partitioned by an inner side of the receiving portion and a lower surface of the molding unit.

3. The apparatus of claim 1, further comprising a pressure measuring unit located below the receiving portion, which measures a pressure transmitted to the receiving portion by pressurization of the molding unit.

4. The apparatus of claim 1, further comprising at least one of:
   a pressure display unit configured to indicate a pressure value controlled by the pressure control unit; and
   a resistance display unit configured to indicate a resistance value measured by the resistance measuring unit.

5. The apparatus of claim 1, wherein the pressure control unit increases the pressure applied to the separator continuously or sequentially from $P_0$ to $P_1$ and decreases the pressure continuously or sequentially from $P_1$ to $P_0$,
   wherein $P_0$ represents a pressure at a state in which the separator is not pressurized, and $P_1$ represents a preset reference pressure, and
   wherein the resistance measuring unit measures a resistance of the separator in real time according to a pressure change by the pressure control unit.

6. The apparatus of claim 1, further comprising a pressure display unit configured to indicate a pressure value controlled by the pressure control unit.

7. The apparatus of claim 1, further comprising a resistance display unit configured to indicate a resistance value measured by the resistance measuring unit.

8. A press type method for measuring a resistance of a separator using an apparatus,
   wherein the apparatus comprises:
      a receiving portion having a structure including: an open upper part; and a lower part and a side surface, which are closed, and thereby receives a separator immersed in an electrolyte solution;
      a molding unit configured to be inserted through the open upper part of the receiving portion to press the received separator;
      a pressure control unit configured to control a pressure applied to the separator by adjusting a height of at least one of the receiving portion and the molding unit;
      a first electrode electrically connected to an inner bottom surface of the receiving portion, and protruding to an outside of the receiving portion; and
      a second electrode electrically connected to a lower surface of the molding unit, and protruding to an outside of the receiving portion;
   wherein the method comprises:
      changing the pressure applied to the separator received by the molding unit inserted through the open upper part of the receiving portion; and
      measuring the resistance of the separator while the pressure is changed,
   wherein the pressure by the pressure control unit is not applied to the first and second electrodes.

9. The method of claim 8, wherein the pressure applied to the received separator is increased continuously or sequentially from $P_0$ to $P_1$, and is decreased continuously or sequentially from $P_1$ to $P_0$, and wherein $P_0$ represents a pressure at a state in which the separator is not pressurized, and $P_1$ represents a preset reference pressure.

10. The method of claim 9, further comprising determining that the separator is defective when any one or more of the following conditions are met:
    an initial resistance ($R_S$) measured at $P_0$ in a process of increasing the pressure is outside a predetermined reference range;
    a resistance measured at pressure $P_1$ ($R_H$) is outside a predetermined reference range; or
    a last resistance ($R_F$) measured at $P_0$ in a process of decreasing the pressure is outside a predetermined reference range.

11. The method of claim 9, further comprising determining that the separator is defective when a difference ($R_D$) between an initial resistance ($R_S$) measured at $P_0$ in a process of increasing the pressure and a last resistance ($R_F$) measured at $P_0$ in a process of decreasing the pressure is outside a predetermined reference range.

12. The method of claim 8, wherein the pressure applied to the received separator is continuously or sequentially changed, and
    wherein the resistance of the separator according to a change in pressure is measured in real time.

* * * * *